US008295790B2

(12) United States Patent
Koren et al.

(10) Patent No.: US 8,295,790 B2
(45) Date of Patent: Oct. 23, 2012

(54) APPARATUS AND METHOD FOR PRE-DISTORTING AND AMPLIFYING A SIGNAL

(75) Inventors: Doron Shahar Koren, Rishon Le Zion (IL); Sergey Toujikov, Rishon Le Zion (IL)

(73) Assignee: Vyycore Ltd., Petah Tikva (IL)

( * ) Notice: Subject to any disclaimer, the term of this patent is extended or adjusted under 35 U.S.C. 154(b) by 204 days.

(21) Appl. No.: 12/634,715

(22) Filed: Dec. 10, 2009

(65) Prior Publication Data

US 2011/0140779 A1 Jun. 16, 2011

(51) Int. Cl.
*H04B 1/04* (2006.01)
*H03C 1/62* (2006.01)

(52) U.S. Cl. ............... 455/114.3; 455/114.1; 455/115.1

(58) Field of Classification Search ............... 455/114.3, 455/114.1, 115.1, 253.2, 341; 375/295, 296, 375/297; 330/149
See application file for complete search history.

(56) References Cited

U.S. PATENT DOCUMENTS

| | | | |
|---|---|---|---|
| 6,459,334 B2* | 10/2002 | Wright et al. | 330/2 |
| 6,630,862 B1* | 10/2003 | Perthold et al. | 330/149 |
| 6,741,663 B1* | 5/2004 | Tapio et al. | 375/297 |
| 7,332,961 B2* | 2/2008 | Blednov | 330/149 |
| 7,535,298 B2* | 5/2009 | Sihlbom et al. | 330/149 |
| 7,920,644 B2* | 4/2011 | Hamada et al. | 375/296 |

OTHER PUBLICATIONS

International Preliminary Report of PCT/IB2010/055521 Dated Jun. 21 2012.

* cited by examiner

*Primary Examiner* — Sonny Trinh
(74) *Attorney, Agent, or Firm* — Reches Patents (57) ABSTRACT

A method and an apparatus. The apparatus includes: a non-linear amplifier for generating an amplified signal, wherein a non-linearity of the non-linear amplifier, unless compensated by a provision of a pre-distorted signal, broadens a spectrum of the amplified signal from a desired spectrum to a broadened spectrum; a partial signature receiver, for receiving the amplified signal and for generating a sensed partial signature that represents spectral components of the amplified signal that belong only to a sampled spectrum that is narrower than the broadened spectrum; a configuration module, for receiving the sensed partial signature and for selecting, based on the sensed partial signature, a selected set of pre-distortion coefficient values that once applied by a signal processing module provides a best compensation to the non-linearity of the non-linear amplifier out of multiple sets of pre-distortion coefficient values that are available to the configuration module; and a signal processing module, for receiving an input signal and the selected set of pre-distortion coefficient values, and for generating a pre-distorted signal by pre-distorting the input signal by utilizing the selected set of pre-distortion coefficient values and for providing the pre-distorted signal to the non-linear amplifier.

18 Claims, 9 Drawing Sheets

APPARATUS AND METHOD FOR PRE-DISTORTING AND AMPLIFYING A SIGNAL

BACKGROUND OF THE INVENTION

Power amplifiers which amplify electric signals may be characterized by non-linearity of the amplification, usually (though not necessarily) when the signal inputted to the amplifier comes closer to a saturation threshold of the amplifier. The non-linearity is indicative of a deviation of the amplification process from a linear amplification process during which the amplification involves amplifying an input signal by a constant amplification factor. Most pre-distortion mechanism require the same clock rate of the analog to digital converter and the digital to analog converter. This drawback leads to a major current consumption on the analog to digital converter. The apparatus and method presented in this application solve this problem.

Preprocessing of the input signal before it reaches the amplifier (also known as pre-distorting) may be implemented to overcome such non-linearity. However, prior art solutions for pre-distorting a signal before amplification are slow, cumbersome, requires a great computational power, and/or not sufficiently effective. There is therefore a great need for simple and effective means of amplification.

SUMMARY

According to an embodiment of the invention an apparatus is provided. It includes a non-linear amplifier for generating an amplified signal, wherein a non-linearity of the non-linear amplifier, unless compensated by a provision of a pre-distorted signal, broadens a spectrum of the amplified signal from a desired spectrum to a broadened spectrum; a partial signature receiver, for receiving the amplified signal and for generating a sensed partial signature that represents spectral components of the amplified signal that belong only to a sampled spectrum that is narrower than the broadened spectrum; a configuration module, for receiving the sensed partial signature and for selecting, based on the sensed partial signature, a selected set of pre-distortion coefficient values that once applied by a signal processing module provides a best compensation to the non-linearity of the non-linear amplifier out of multiple sets of pre-distortion coefficient values that are available to the configuration module; and a signal processing module, for receiving an input signal and the selected set of pre-distortion coefficient values, and for generating a pre-distorted signal by pre-distorting the input signal by utilizing the selected set of pre-distortion coefficient values and for providing the pre-distorted signal to the non-linear amplifier.

According to an embodiment of the invention a method is provided. The method includes: generating an amplified signal by a non-linear amplifier, wherein a non-linearity of the non-linear amplifier, unless compensated by a provision of a pre-distorted signal, broadens a spectrum of the amplified signal from a desired spectrum to a broadened spectrum; receiving the amplified signal and generating a sensed partial signature that represents spectral components of the amplified signal that belong only to a sampled spectrum that is narrower than the broadened spectrum; selecting, based on the sensed partial signature, a selected set of pre-distortion coefficient values that once applied by a signal processing module provides a best compensation to the non-linearity of the non-linear amplifier out of multiple sets of the pre-distortion coefficient values that are available to the configuration module; pre-distorting an input signal by utilizing the selected set of pre-distortion coefficient values to provide the pre-distorted signal to the non-linear amplifier; and amplifying the pre-distorted signal by the non-linear amplifier.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 1:
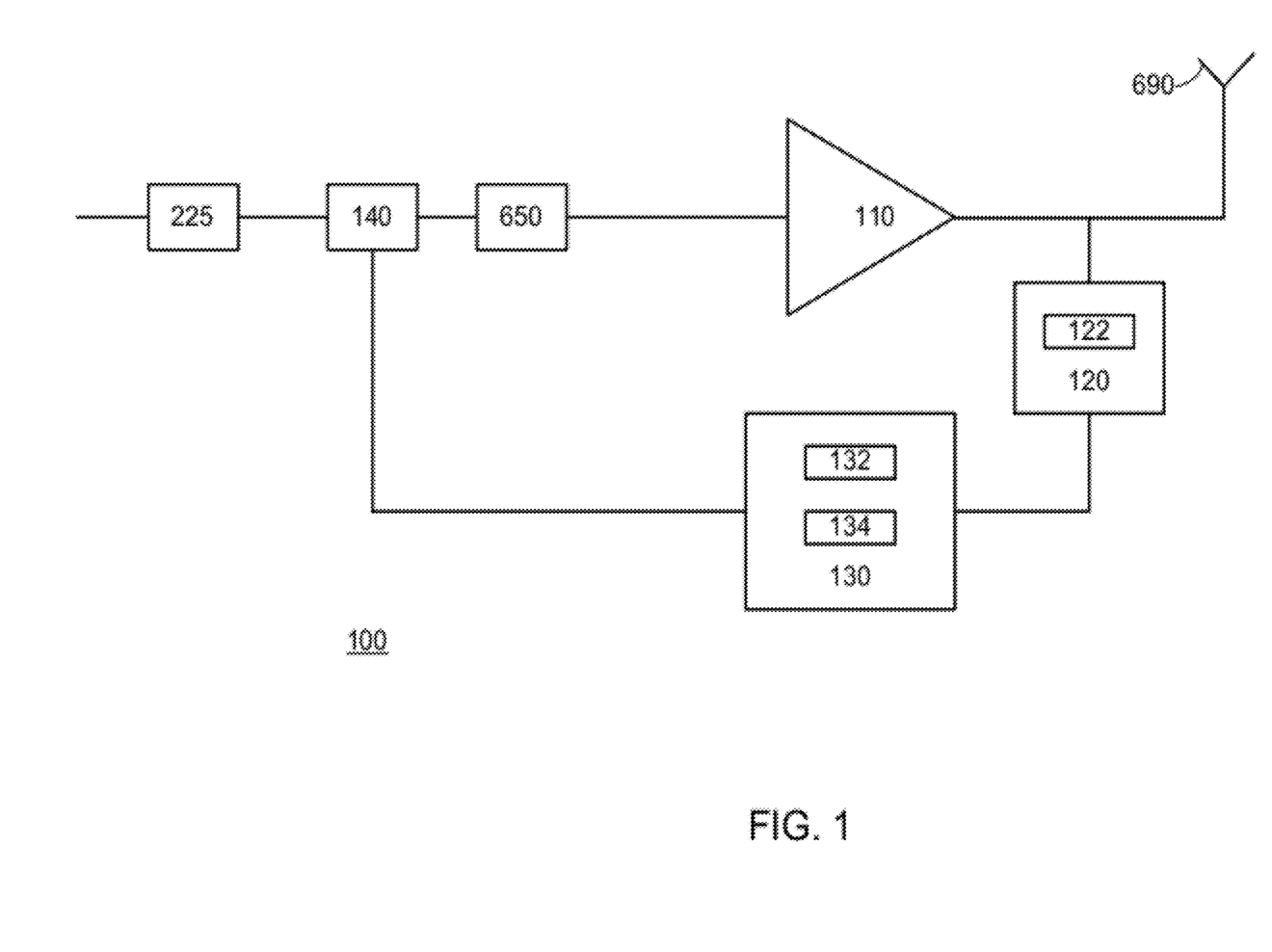
FIG. 1 illustrates an apparatus, according to an embodiment of the invention.

FIG. 1 illustrates apparatus 100, according to an embodiment of the invention.

Apparatus 100 includes non-linear amplifier 110, partial signature receiver 120, configuration module 130, front end module 650 and signal processing module 140. FIG. 1 also illustrates antenna 690 that transmits an amplified signal that is provided by the non-linear amplifier. Antenna 690 can be included in the apparatus 100 but this is not necessarily so.

Front end module 650 can include one or more digital to analog converters, one or more filters (such as low pass filters), I and Q mixers, local oscillator, 90 degree phase offset, a combiner and a gain controllable pre-amplifier. The front end module 650 receives digital signals (such as pre-distorted digital signals) from the signal processing module 140 and provides an analog signal (such as pre-distorted analog signals) to non-linear amplifier 110.

The non-linear amplifier 110 is configured to generate an amplified signal. The non-linearity of the non-linear amplifier, unless compensated by a provision of a pre-distorted signal, broadens a spectrum of the amplified signal from a desired spectrum to a broadened spectrum.

The desired spectrum should be equal to the spectrum of a signal that is amplified by the non-linear amplifier 110. The non-linearity of the non-linear amplifier 110 also introduces unwanted spectral components within the desired bandwidth.

The broadened spectrum can be much wider then the desired bandwidth. For example, it can be twice of the desired spectrum, trice of the desired spectrum and even much more. While the desired spectrum can be 10-20 Megahertz wide, the broadened spectrum can be 60-100 Megahertz wide.

Figure 2:
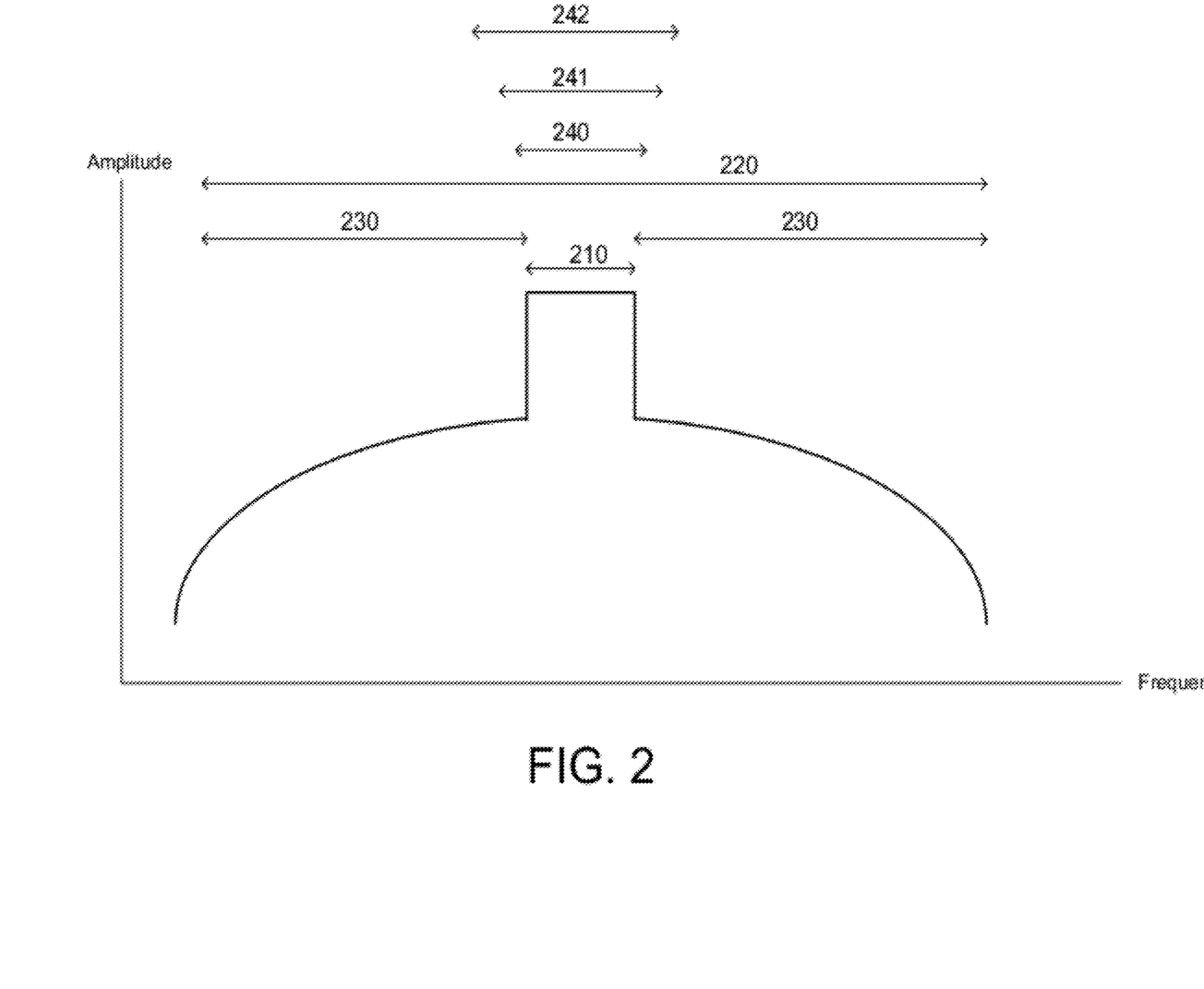
FIG. 2 illustrates a broadened spectrum of an amplified signal, a desired spectrum and a few sampled spectrums according to various embodiments of the invention.

FIG. 2 illustrates a broadened spectrum of an amplified signal, a desired spectrum and a few sampled spectrums according to various embodiments of the invention.

The desired spectrum 210 is substantially equal to the spectrum of a signal that is amplified by the non-linear amplifier 110. The broadened spectrum 220 is much wider than the desired spectrum 210. It includes the desired spectrum 210 and a so-called additional spectrum 230. The spectral components that form the additional spectrum 210 are also referred to as skirt.

FIG. 2 illustrates various sampled spectrums 240, 241 and 242. Spectral components of the amplified signal that are within a sampled spectrum are processed to provide a partial signature. Sampled spectrums 240, 241 and 242 provide alternate embodiments of the sampled spectrum. Narrower sampled spectrums can be samples at a lower sampling rate but may include less information about the current non-linearity of the non-linear amplifier 110, while wider sampled spectrums require a higher sampling rate.

Sampled spectrum 240 is broader then the desired spectrum 210 by 50% of a bandwidth of the desired spectrum 210. Sampled spectrum 241 is broader then the desired spectrum 210 by 20% of a bandwidth of the desired spectrum 210. Sampled spectrum 242 is broader then the desired spectrum 210 by 100% of a bandwidth of the desired spectrum 210.

It is noted that other relationships between the width of the desired spectrum 210 and the sampled spectrum can be applied. Additionally or alternatively, the sampled spectrum 210 can be defined as a fraction (0.5, 0.2, 0.1 and the like) of the broadened spectrum 220.

Referring back to FIG. 1, partial signature receiver 120 is adapted to receive the amplified signal and generate a sensed partial signature that represents spectral components of the amplified signal that belong only to a sampled spectrum that is narrower than the broadened spectrum. The partial signature receiver 120 can receive only a portion (in terms of frequency, amplitude and the like) of the amplified signal.

Partial signal generator 120 can include a coupler for receiving a portion of the amplified signal that is sent to antenna 690, a low noise amplifier, a differential amplifier, I and Q mixers, local oscillator, 90 degree phase offset, one or more filters (such as low pass filters, band pass filters, high pass filters), one or more analog to digital converters, and diplexers that can send part of the signal to a receiver and part of the signal to the configuration module 130. The filters and the analog to digital converters can reject spectral components outside the sampled spectrum. The filtering applied by the filters and the sampling rate of the analog to digital converters limit the spectrum of the spatial signature.

Partial signal generator 120 generates a sensed partial signature that can include multiple digital samples. The digital samples can be provides by an analog to digital converter 122 of the partial signature receiver 120. It is noted that these samples can be further processed by pre-distorting, time-to-frequency domain conversion and the like.

The analog to digital converter 122 samples the amplified signal at a sampling rate that corresponds to the sampled spectrum. The sampling frequency can be twice the bandwidth of the sampled spectrum in order to comply with the Nyquist sampling condition. The sampling rate of the analog to digital converter can be less than half of a sampling rate that corresponds to a bandwidth of the broadened spectrum thus folding the spectral skirt in band.

According to an embodiment of the invention the configuration module 130 can select between sets of pre-distortion coefficient values that are generated by calculating Volterra-based approximations of the non-linearity of the non-linear amplifier 110. Volterra-based approximations are approximations of Volterra series that can be used to evaluate the non-linearity of the non-linear amplifier 110. These pre-distortion coefficient values can be values of pre-distortion coefficients that are used to pre-distort digital signals during a pre-distorting process that may be aimed to perform (or at least assist in) a pre-distortion.

The sets of pre-distortion coefficient values can be simulated or otherwise calculated. They can be calculated by feeding, during a test period, the non-linear amplifier 110 with test signals and measuring the spectrum of the amplified signals. The test signals can be pre-distorted before being provided to the non-linear amplifier 110 by applying tested sets of pre-distortion coefficient values, until obtaining desired pre-distortion performance. The sets of pre-distortion coefficient values can be dynamically updated based on the success s (or failure) of the pre-distortion applied by the signal processing module 140.

The configuration module 130 is configured to receive the sensed partial signature and select, based on the sensed partial signature, a selected set of pre-distortion coefficient values. This selected set of pre-distortion coefficient values can be a best matching set in the sense that once applied by the signal processing module 140 the signal processing module 140 provides the best pre-distorted signal to the non-linear amplifier 110.

The selected set of pre-distortion coefficient values provides the best compensation to the non-linearity of the non-linear amplifier 110 out of multiple sets of the pre-distortion coefficient values that are available to the configuration module 130.

If, for example the configuration module can select the set of pre-distortion coefficient values output multiple (K) sets then the selected set should provide the best compensation out of these K sets.

The pre-distortion coefficient values can be coefficients or set of coefficient values that can be further processed by the signal processing module 140 to provide said taps. For example, the signal processing model can apply interpolation, time-to-frequency domain conversion, frequency-to-time domain conversion, pre-distorting (especially pre-distortion pre-distorting) and the like on the selected set of pre-distortion coefficient values to provide the taps of the pre-distorter that is applied by the signal processing module 140 on an input signal.

The configuration module 130 can include a retrieval module 132 and a memory unit 134. The memory unit 134 stores sets of pre-distortion coefficient values and the retrieval module 132 can send to the memory unit addresses that select the selected set of pre-distortion coefficient values. The memory unit 134 can act as a cache memory and store only a part of the available sets of pre-distortion coefficient values. The configuration module 130 can control the flow of sets of pre-distortion coefficient values between memory unit 134 and other memory units (not shown).

Signal processing module 140 is configured to receive an input signal and the selected set of pre-distortion coefficient values. It is configured to generate a pre-distorted signal by pre-distorting the input signal while utilizing the selected set of pre-distortion coefficient values to provide the pre-distorted signal to the non-linear amplifier 110. The signal processing module 140 can apply a configurable pre-distorting scheme in order to compensate for the non-linearity of the non-linear amplifier 110.

Each set of pre-distortion coefficient values is expected to compensate for the non-linearity of the non-linear amplifier 110 by reducing spectral components that belong to the broadened spectrum—even to spectral components that reside outside the sampled spectrum. The signal processing module 140 should pre-distort the input signal by a pre-distorting process that has a compensating broadened spectrum finite impulse response that affects the broadened spectrum and not only the sampled spectrum.

It is noted that signal processing module 140 may include hardware, software, and/or firmware components, and any combination thereof. It is noted that conveniently, the processing of the signal may be carried out by hardware components of signal processing module 140, such as a hardware non linear filter.

According to an embodiment of the invention the set of pre-distortion coefficient values can include one or more pre-distortion coefficient values. For example, the set can include a single complex coefficient that is multiplied by the entire input signal (that in turn can include multiple samples). It is noted that multiplying the entire input signal by a single complex compensation coefficient (or multiplying components of the complex input signal by two real parameters, which correspond to a complex parameter) is conveniently a relatively fast and not complex way of pre-distorting the input signal.

According to another embodiment of the invention the set of pre-distorting values includes one or more analog signal that is used to process the input signal in an analog manner.

It is noted that the signal processing module 140 can pre-distort the input signal not only to compensate for the non-linearity of the non-linear amplifier 110 but also to overcome distortions introduces by other components of the apparatus (such as a digital to analog converter, an analog to digital converter, a frequency converter and the like) or even of an antenna through which the amplified signal is transmitter.

According to an embodiment of the invention the signal processing module 140 may not always pre-distort the input signal by a set of pre-distortion coefficient values. Preventing the pre-distorting or at least enabling a simple trivial pre-distorting that does not substantially modify the input signal may facilitate the amplification, reduce computational power, and may even reduce the number of interferences with the input signal, thus increasing a quality of the amplification.

For example, if the input signal is determined (by signal processing module 140 or a preceded module) to be of electrical parameters in which the amplification by the non-linear amplifier 110 will be substantially linear, processing may not be required.

According to an embodiment of the invention the signal processing module can elect simpler pre-distorting schemes if these simpler pre-distortion schemes will provide adequate pre-distortion. The number of pre-distortion coefficient values within different sets of pre-distortion coefficient values can differ from one to another. Thus, if it is expected that the non-linearity of the non-linear amplifier 110 is expected to be relatively low a simple pre-distorter (small number of taps) can be applied. For example—such a simple pre-distorter can be applied at relatively low temperatures.

Figure 3:
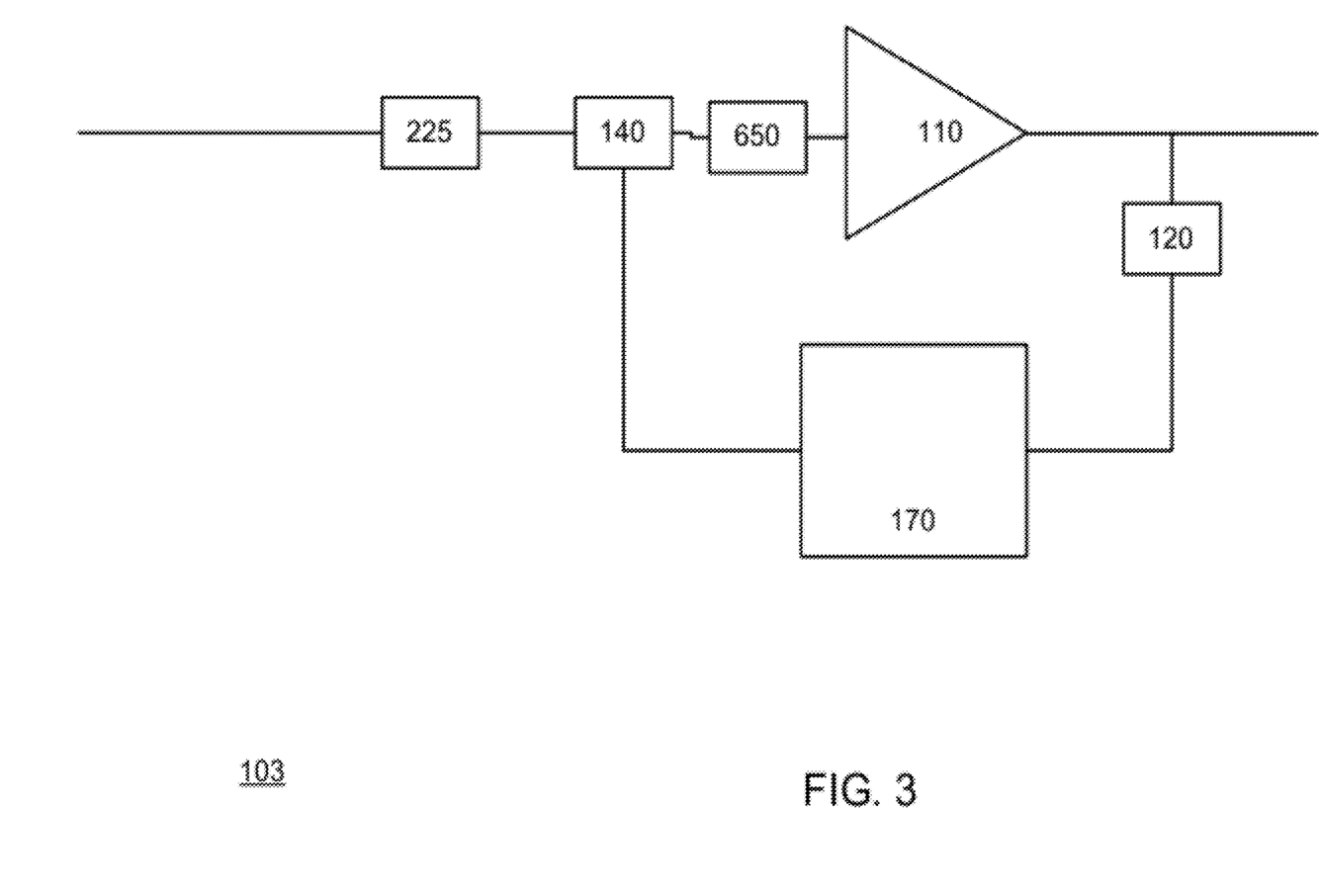
FIG. 3 illustrates an apparatus, according to an embodiment of the invention.

FIG. 3 illustrates an apparatus 103 according to another embodiment of the invention.

Apparatus 103 differs from apparatus 100 of FIG. 1 by including a Volterra-based approximation module 170 that is configured to receive the partial signature from partial signature receiver 120 and for generating the selected set of pre-distortion coefficient values by applying a Volterra-based approximation based on the partial signature.

Figure 7:
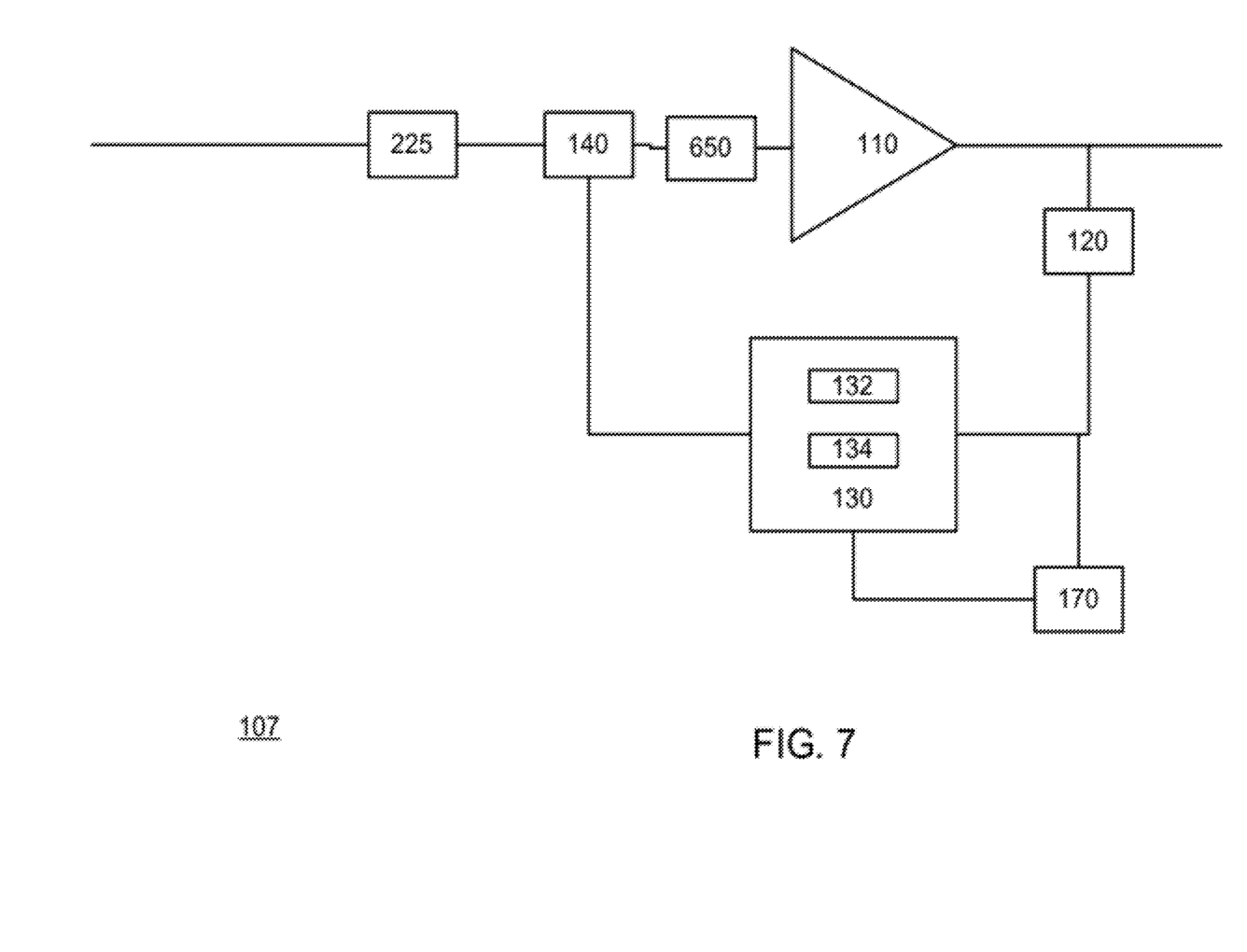
FIG. 7 illustrates an apparatus, according to an embodiment of the invention.

Additionally or alternatively the Volterra-based approximation module 170 can provide a selection indicator that will assist configuration module 130 in selecting a selected set of pre-distortion coefficient values. FIG. 7 illustrates an apparatus 107 that includes both Volterra-based approximation module 170 and configuration module 130.

Figure 4:
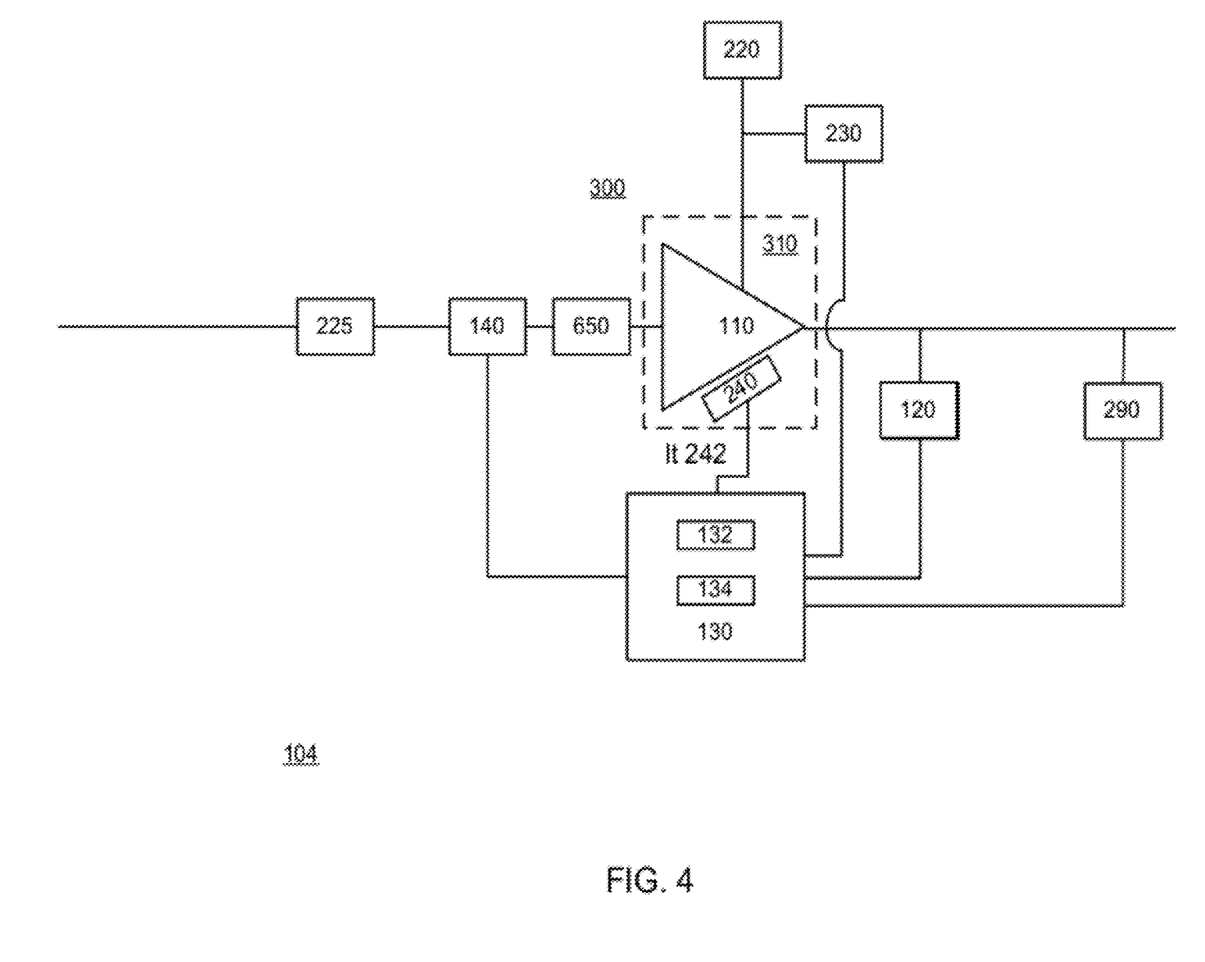
FIG. 4 illustrates an apparatus, according to an embodiment of the invention.

FIG. 4 illustrates an apparatus 104 according to another embodiment of the invention.

Apparatus 104 differs from apparatus 100 of FIG. 1 by including one or more sensors such as temperature sensor 240, power sensor 290 and supply voltage sensor 230.

The temperature sensor 240 is configured to sense a temperature of the non-linear amplifier 110 and output an amplifier temperature indicator.

The apparatus 104 can include one or more digital regions and one or more analog regions. FIG. 4 illustrates a single digital region 300 and a single Analog region 310. The digital region 300 includes digital circuits (such as signal processing module 140). The analog region 310 includes analog circuits such as non-linear amplifier 110 and temperature sensor 240.

Temperature sensor 240 should sense the temperature of the non-linear amplifier 110 and should be very close to the non-linear amplifier 110. It can even be integrated with the non-linear amplifier 110 in order to sense the exact temperature of non-linear amplifier 110.

This proximity allows ignoring erroneous temperature measurements or biases introduced from the ambient temperature or other components of the apparatus.

The power sensor 290 is connected to an output of the non-linear amplifier 110 and measures the saturation power (usually the Maximum peak power) and the output signal average Power of the non-linear amplifier 110. The power sensor 290 sends an amplifier saturation power indicator to the configuration module 130.

The supply voltage sensor 230 monitors the level of the supply voltage that is supplied to the non-linear amplifier 110 by the voltage supply unit 220. The supply voltage sensor 230 sends to the configuration module 130 a supply voltage indicator.

As indicated above, these one or more sensors sense at least one working condition parameter of the non-linear amplifier 110 and generate at least one working condition indicator (temperature indicator, amplifier power indicator and supply voltage indicator). These one or more working condition indicators are sent to the configuration module 130 that in turn selects the selected set of pre-distortion coefficient values based on the at least one working condition indicator and the sensed partial signature.

Figure 5:
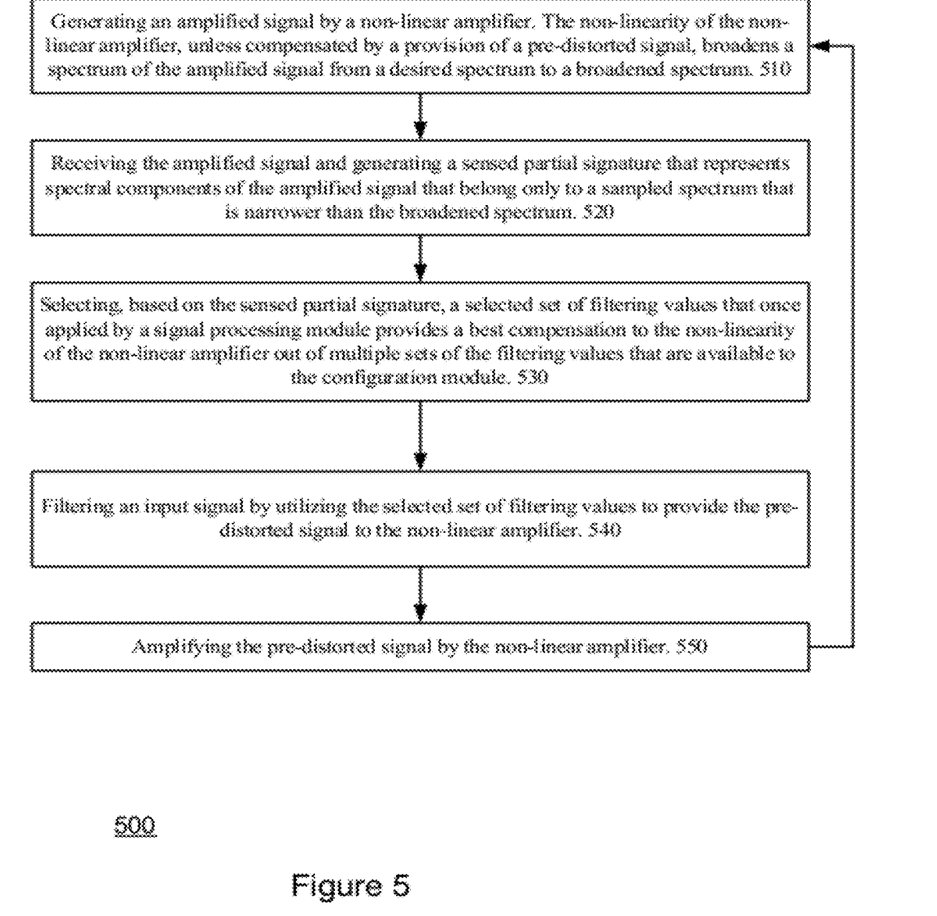
FIG. 5 illustrates a method for processing and amplifying a signal, according to an embodiment of the invention.

FIG. 5 illustrates method 500 for processing and amplifying a signal, according to an embodiment of the invention.

Method 500 starts by stage 510 of generating an amplified signal by a non-linear amplifier. The non-linearity of the non-linear amplifier, unless compensated by a provision of a pre-distorted signal, broadens a spectrum of the amplified signal from a desired spectrum to a broadened spectrum.

Stage 510 can include amplifying a first signal that is not pre-distorted so that the amplified signal has a broadened signal.

Stage 510 can include amplifying a first signal that is at least partially pre-distorted so that the spectrum of the amplified signal can be narrower than the spectrum without the appliance of the pre-distortion.

Stage 510 is followed by stage 520 of receiving the amplified signal and generating a sensed partial signature that represents spectral components of the amplified signal that belong only to a sampled spectrum that is narrower than the broadened spectrum.

Stage 520 is followed by stage 530 of selecting, based on the sensed partial signature, a selected set of pre-distortion coefficient values that once applied by a signal processing module provides a best compensation to the non-linearity of the non-linear amplifier out of multiple sets of the pre-distortion coefficient values that are available to the configuration module.

Stage 530 is followed by stage 540 of pre-distorting an input signal by utilizing the selected set of pre-distortion coefficient values to provide the pre-distorted signal to the non-linear amplifier.

Stage 540 is followed by stage 550 of amplifying the pre-distorted signal by the non-linear amplifier.

Stage 550 can be followed by stage 510. Stages 510-550 can be executed each period, whenever an input signal is received and the like.

Each partial signature of the multiple partial signatures can represents only spectral components of the amplified signal within the desired spectrum.

Each partial signature of the multiple partial signatures represents only spectral components of the amplified signal within sampled spectrum that can be broader then the desired spectrum.

Stage 530 can include selecting a selected set of pre-distortion coefficient values that corresponds to a compensating broadened spectrum.

Stage 520 can include generating the sensed partial signature by an analog to digital converter that samples the amplified signal at a sampling rate that corresponds to the sampled spectrum and is less then the sampling rate that corresponds to a bandwidth of the broadened spectrum.

Stage 530 can include selecting between sets of pre-distortion coefficient values that are generated by calculating Volterra-based approximations of the non-linearity of the non-linear amplifier.

Stage 520 can include generating the selected set of pre-distortion coefficient values by applying a Volterra-based approximation based on the partial signature.

Figure 6:
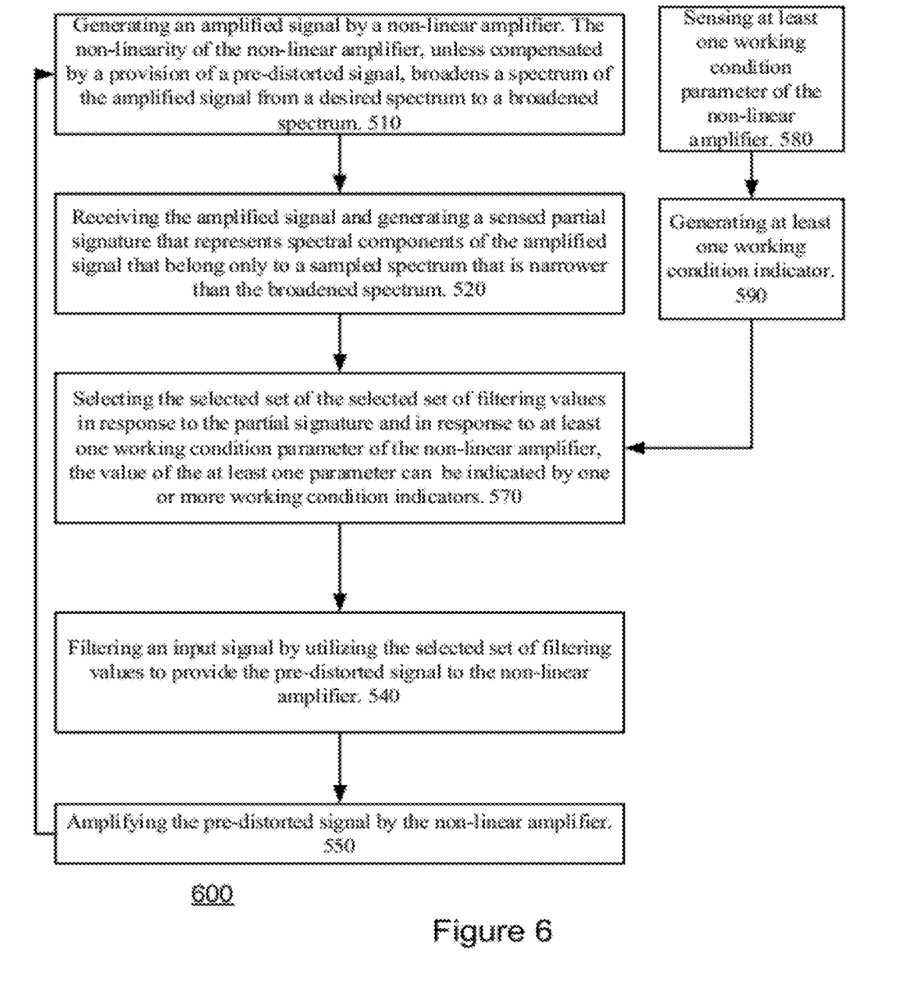
FIG. 6 illustrates a method for processing and amplifying a signal, according to an embodiment of the invention.

FIG. 6 illustrates method 600 for processing and amplifying a signal, according to an embodiment of the invention.

Method 600 of FIG. 6 differs from method 500 of FIG. 5 by the following changes: (i) Stage 530 is replaced by stage 570 of selecting the selected set of pre-distortion coefficient values in response to the partial signature and in response to at least one working condition parameter of the non-linear amplifier, the value of the at least one parameter can be indicated by one or more working condition indicators; (ii) the inclusion of stage 580 of sensing at least one working condition parameter of the non-linear amplifier, and (iii) the inclusion of stage 590 of generating at least one working condition indicator.

Figure 8:
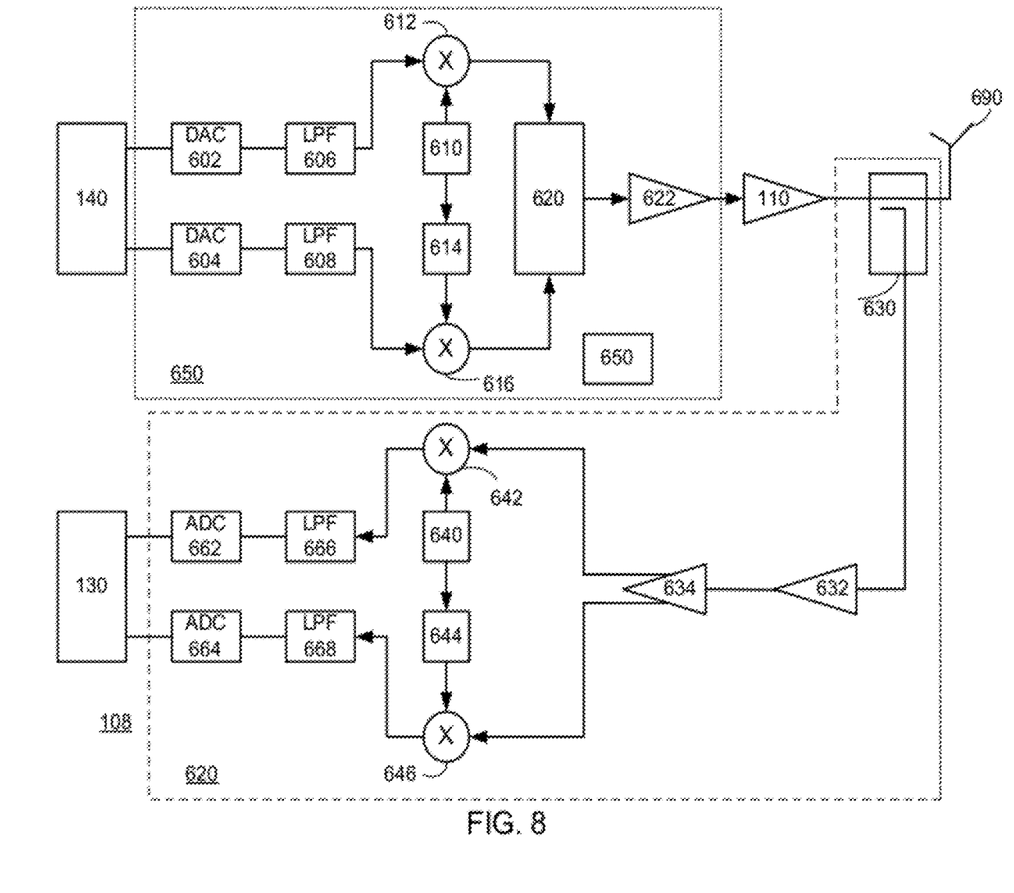
FIG. 8 illustrates an apparatus according to an embodiment of the invention.

FIG. 8 illustrates apparatus 108 according to an embodiment of the invention.

FIG. 8 illustrates an apparatus that includes an I branch and a Q branch for processing and amplifying an I part and a Q part of an input signal.

Apparatus 108 includes non-linear amplifier 110, partial signature receiver 120, configuration module 130, front end module 650 and signal processing module 140.

FIG. 8 also illustrates antenna 690 that transmits an amplified signal that is provided by the non-linear amplifier. Antenna 690 can be included in the apparatus 108 but this is not necessarily so.

FIG. 8 illustrates that signal processing module 140 processed the I part and Q part of an input signal and sends a pre-distorted I signal and a pre-distorted Q signal to front end module 650 and especially to digital to analog converters 602 and 604 of the front end module. Digital to analog converters 602 and 604 convert these digital signals to analog signals that are provided to low pass filters 606 and 608. The analog signals that are outputted from these low pass filters are up-converted by I mixer 612, Q mixer 616, local oscillator 610 and 90 degree phase offset 614 to provide a pair of up-converted signals that are summed by combiner 620 and sent to gain controllable pre-amplifier 622 of the front end module 650. Gain controllable pre-amplifier 622 provides an analog pre-distorted signal to non-linear amplifier 110.

Partial signature generator 120 includes coupler 630 for providing a portion of the amplified signal that is sent to antenna 690, a low noise amplifier 632 that receives the sampled portion, a differential amplifier 634 that is connected to the low noise amplifier 632 to provide an analog I signal and an analog Q signal to a down-conversion unit that includes I and Q mixers 642 and 646, local oscillator 640, 90 degree phase offset 644, one or more filters (such as low pass filters 666 and 668, band pass filters, high pass filters), and one or more analog to digital converters 662 and 664.

Apparatus 108 can also include a diplexer (not shown) that can send part of the signal to a receiver and part of the signal to the configuration module 130.

Figure 9:
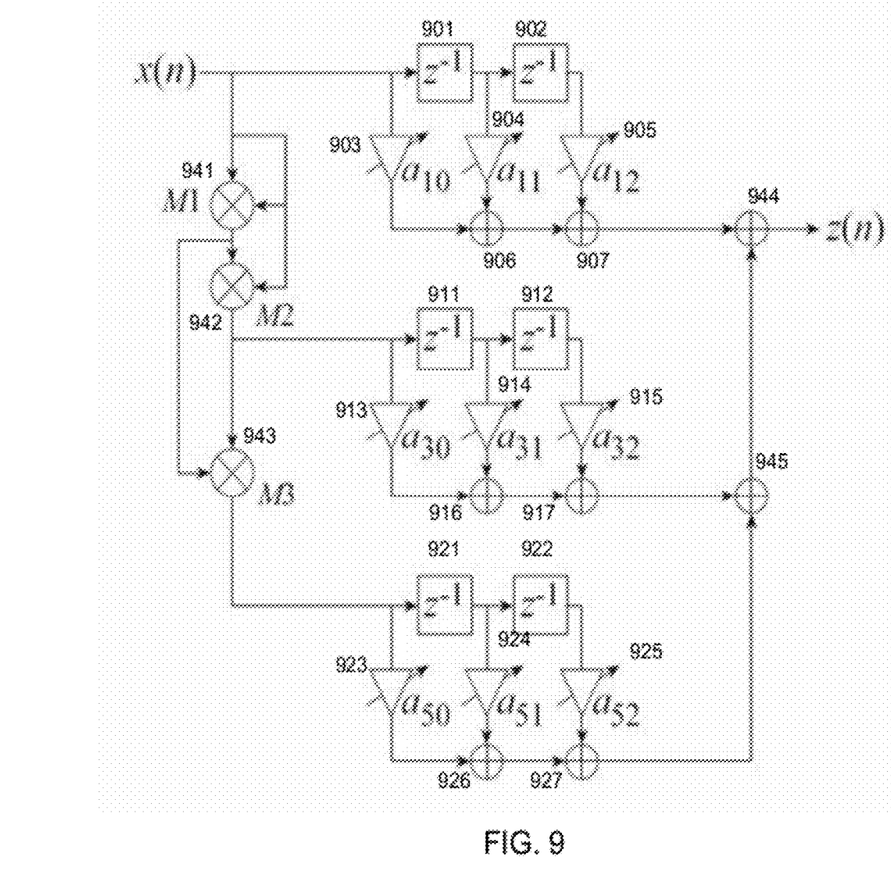
FIG. 9 illustrates a Volterra based pre-distortion process according to an embodiment of the invention.

FIG. 9 illustrates a Volterra based pre-distortion process, according to an embodiment of the invention.

The pre-distortion process can be a part of a pre-distorting process (or the entire pre-distorting process) applied by any of the mentioned above apparatuses.

The Volterra based pre-distortion process is represented by delay units 901, 902, 911, 912, 921 and 921, adders 906, 907, 916, 917, 926, 927, 944 and 945, multipliers 941, 942, 943, 903, 904, 905, 913, 914, 915, 923, 924 and 925.

Multipliers 903, 904, 905, 913, 914, 915, 923, 924 and 925 are fed by pre-distorting values a10, a11, a12, a30, a31, a32, a50, a51 and a52.

The input of the Volterra based pre-distortion process is denoted $X(n)$ and the output is denoted $Z(n)$. $Z(n)=x(n)*a10+x(n-1)*a11+x(n-2)*a12+x(n)^3*a30+x(n-1)^3*a31+x(n-2)^3*a32+x(n)^5*a50+x(n-1)^5*a51+x(n-2)^5*a52$.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:
1. An apparatus, comprising:
a non-linear amplifier for generating an amplified signal, wherein a non-linearity of the non-linear amplifier, unless compensated by a provision of a pre-distorted signal, broadens a spectrum of the amplified signal from a desired spectrum to a broadened spectrum;

a partial signature receiver, for receiving the amplified signal and for generating a sensed partial signature that represents spectral components of the amplified signal that belong only to a sampled spectrum that is narrower than the broadened spectrum;

a configuration module, for receiving the sensed partial signature and for selecting, based on the sensed partial signature, a selected set of pre-distortion coefficient values that once applied by a signal processing module provides a best compensation to the non-linearity of the non-linear amplifier out of multiple sets of pre-distortion coefficient values that are available to the configuration module; and a signal processing module, for receiving an input signal and the selected set of pre-distortion coefficient values, and for generating a pre-distorted signal by pre-distorting the input signal by utilizing the selected set of pre-distortion coefficient values and for providing the pre-distorted signal to the non-linear amplifier.

2. The apparatus according to claim 1, wherein each partial signature of the multiple partial signatures represents only spectral components of the amplified signal within the desired spectrum.

3. The apparatus according to claim 1, wherein each partial signature of the multiple partial signatures represents only spectral components of the amplified signal within sampled spectrum that twice of the desired spectrum.

4. The apparatus according to claim 1, wherein the selection module is configured to select a selected set of pre-distortion coefficient values that corresponds to a compensating broadened spectrum finite impulse response.

5. The apparatus according to claim 1, wherein the partial signature receiver comprises an analog to digital converter that samples the amplified signal at a sampling rate that corresponds to the sampled spectrum and is less than half of a sampling rate that corresponds of a bandwidth of the broadened spectrum.

6. The apparatus according to claim 1, wherein the configuration module selects between predetermined sets of pre-distortion coefficient values that are generated by calculating Volterra-based approximations of the non-linearity of the non-linear amplifier.

7. The apparatus according to claim 1, comprising a Volterra-based approximation module for receiving the partial signature and for generating the selected set of pre-distorting values by applying a Volterra-based approximation based on the partial signature.

8. The apparatus according to claim 1, further comprising at least one sensor for sensing at least one working condition parameter of the non-linear amplifier and for generating at least one working condition indicator, wherein the a configuration module is configured to select the selected set of pre-distortion coefficient values based on the at least one working condition indicator and the sensed partial signature.

9. The apparatus according to claim 1, wherein the sampled spectrum one fifth of the broadened spectrum.

10. The apparatus according to claim 1, wherein the sampled spectrum one tenth of the broadened spectrum.

11. A method for amplifying an input signal, the method comprising:

generating an amplified signal by a non-linear amplifier, wherein a non-linearity of the non-linear amplifier, unless compensated by a provision of a pre-distorted signal, broadens a spectrum of the amplified signal from a desired spectrum to a broadened spectrum;

receiving the amplified signal and generating a sensed partial signature that represents spectral components of the amplified signal that belong only to a sampled spectrum that is narrower than the broadened spectrum;

selecting, based on the sensed partial signature, a selected set of pre-distortion coefficient values that once applied by a signal processing module provides a best compensation to the non-linearity of the non-linear amplifier out of multiple sets of the pre-distortion coefficient values that are available to the configuration module;

pre-distorting an input signal by utilizing the selected set of pre-distortion coefficient values to provide the pre-distorted signal to the non-linear amplifier; and amplifying the pre-distorted signal by the non-linear amplifier.

12. The method according to claim 11, wherein each partial signature of the multiple partial signatures represents only spectral components of the amplified signal within the desired spectrum.

13. The method according to claim 11, wherein each partial signature of the multiple partial signatures represents only spectral components of the amplified signal within a sampled spectrum that is twice of the desired spectrum.

14. The method according to claim 11, comprising selecting a selected set of pre-distorting values that corresponds to a compensating broadened spectrum finite impulse response.

15. The method according to claim 11, comprising generating the sensed partial signature by an analog to digital converter that samples the amplified signal at a sampling rate that corresponds to the sampled spectrum and is less than half of a sampling rate that corresponds to a bandwidth of the broadened spectrum.

16. The method according to claim 11, comprising selecting between sets of pre-distortion coefficient values that are generated by calculating Volterra-based approximations of the non-linearity of the non-linear amplifier.

17. The method according to claim 11, comprising generating the selected set of pre-distortion coefficient values by applying a Volterra-based approximation based on the partial signature.

18. The method according to claim 11, comprising:
sensing at least one working condition parameter of the non-linear amplifier;
generating at least one working condition indicator; and
selecting the selected set of pre-distorting values based on the at least one working condition indicator and the sensed partial signature.

* * * * *